United States Patent

Doi et al.

[11] Patent Number: 5,757,257
[45] Date of Patent: May 26, 1998

[54] PERMANENT CURRENT SWITCH AND SUPERCONDUCTING MAGNET SYSTEM

[75] Inventors: Toshiya Doi; Takesi Ozawa, both of Hitachi; Katsuzo Aihara, Hitachiota; Tomoichi Kamo, Naka-gun; Kazuhisa Mori; Nobuhiro Hara, both of Hitachi, all of Japan

[73] Assignee: Hitachi, Ltd., Tokyo, Japan

[21] Appl. No.: 309,415

[22] Filed: Sep. 20, 1994

[30] Foreign Application Priority Data

Sep. 20, 1993 [JP] Japan .................. 5-232780

[51] Int. Cl.⁶ .................................................. H01F 1/00
[52] U.S. Cl. ............................ 335/216; 335/296; 324/318
[58] Field of Search ......................... 335/216, 296–306; 324/318–20; 174/125.1; 505/813, 704, 887

[56] References Cited

U.S. PATENT DOCUMENTS

| | | | |
|---|---|---|---|
| 4,830,703 | 5/1989 | Matsutani | 156/617.1 |
| 5,189,386 | 2/1993 | Tada et al. | 335/216 |
| 5,298,679 | 3/1994 | Wu et al. | 335/216 |
| 5,343,182 | 8/1994 | Ohta | 335/299 |

FOREIGN PATENT DOCUMENTS

| | | |
|---|---|---|
| A-59-96786 | 6/1984 | Japan . |
| A-60-7781 | 1/1985 | Japan . |
| A-60-22383 | 2/1985 | Japan . |
| A-60-37790 | 2/1985 | Japan . |
| A-60-46084 | 3/1985 | Japan . |
| 62-060280 | 3/1987 | Japan . |
| 63-081874 | 4/1988 | Japan . |
| 63-237509 | 10/1988 | Japan . |
| 1032604 | 2/1989 | Japan . |
| A-1-194310 | 8/1989 | Japan . |
| A-1-196685 | 8/1989 | Japan . |
| 4079381 | 3/1992 | Japan . |
| A-4-176174 | 6/1992 | Japan . |

*Primary Examiner*—Lincoln Donovan
*Attorney, Agent, or Firm*—Antonelli, Terry, Stout & Kraus, LLP.

[57] ABSTRACT

Superconducting magnet system using a liquid helium for its operation and a permanent current switch and a system thereof applied to the superconducting magnet system employing a permanent current loop created by a superconducting material developing superconductivity when cooled. The system includes a superconducting magnet dipped in the liquid helium, the permanent current switch for driving or interrupting the superconducting magnet, and a cryostat for accommodating the superconducting magnet and the permanent current switch, and the permanent current switch is arranged over a liquid surface of the liquid helium.

40 Claims, 5 Drawing Sheets

FIG. 6
FIG. 8
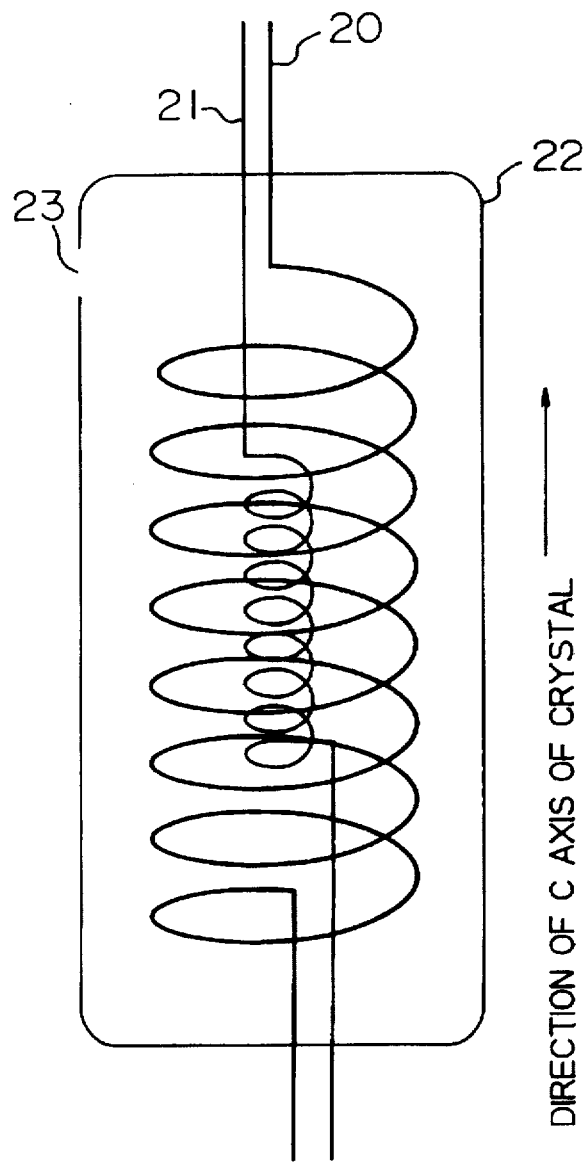
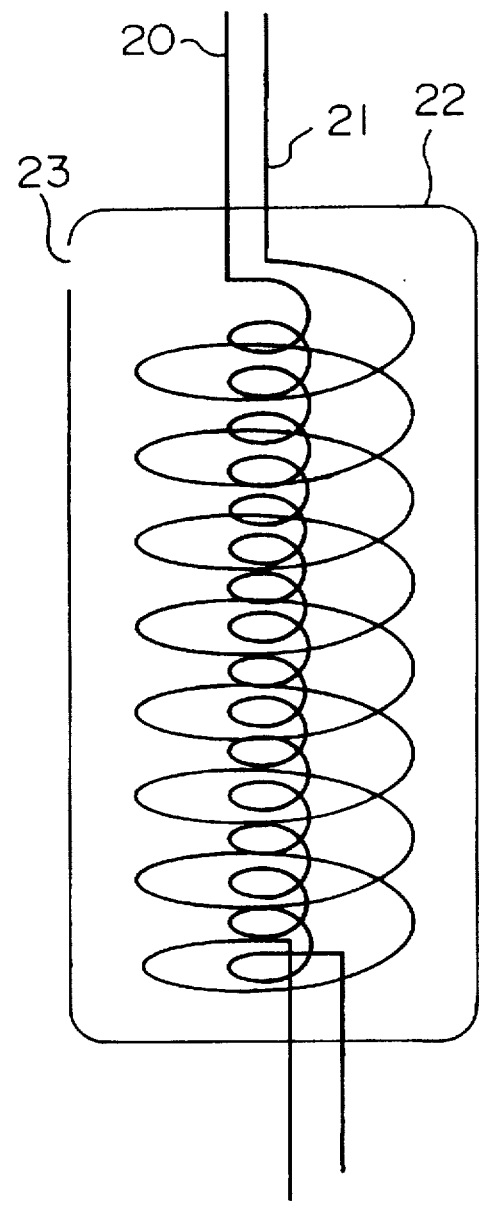
DIRECTION OF C AXIS OF CRYSTAL → ies 5,757,257

PERMANENT CURRENT SWITCH AND SUPERCONDUCTING MAGNET SYSTEM

BACKGROUND OF THE INVENTION

The present invention relates to a superconducting system using a liquid helium for its operation, and to a permanent current switch and a system thereof applied to a superconducting system employing a permanent current loop created by a superconducting material developing superconductivity when cooled.

In a superconducting apparatus utilizing the permanent current state, a permanent current switch and a superconducting coil are connected to each other for operation. However, since superconducting wirings adopted in the permanent current switch leads to increase in electric resistance in an off state, there is used in many cases a configuration in which a multiplicity of superconducting filaments are buried in such a metal base material having a high resistivity as cupronickel. In such a superconducting wiring, the metal base material has quite a low heat conductivity as compared with a low-resistance metal such as copper. Consequently, even when heat is generated therein due to quite a small external disturbance, there locally appears a great increase in temperature and hence there is likely to occur an abrupt transition to a normal conduction state (quenching). In consequence, there have been devised many ideas to prevent generation of such an unstableness as disclosed, for example, in the JP-A-59-96786, JP-A-60-7781, JP-A-60-22383, JP-A-60-37790, and JP-A-60-46084. However, there has not been obtained a satisfactory stability in the present stage.

In addition, there has been proposed a technology of fabricating a permanent current switch with an oxide superconducting material having a high Tc, for example, in the JP-A-1-194310, JP-A-1-196685, JP-A-1-194310, and JP-A-4-176174. In any one of the above cases, considerations have not been given to processing of a large amount of heat generated to keep the OFF state of the permanent current switch, which leads to a problem of quite a great loss of the liquid helium.

In each of the JP-A-59-96786, JP-A-60-7781, JP-A-60-22383, JP-A-60-37790, and JP-A-60-46084 of the prior art, the connecting portion is strongly fixed in a mechanical fashion to prevent the quenching due to frictionally created heat. In such a conventional technology, as a superconducting material used in the permanent current switch, there has been adopted a substance having a superconducting critical temperature (Tc) equal to or less than 20K, leading hence to a reduced temperature margin. In consequence, for a stable operation of the permanent current switch in the on state (superconducting state), it is necessary to fully stabilize the superconducting wirings. In ordinary cases, for stabilization of the superconducting wirings, there is employed a countermeasurement in which fine wirings manufactured with a superconducting material are combined with a metal such as copper or aluminum having a high heat conductivity and a low electric resistance. However, for the permanent current switch to realize the switch off state (normal conduction state), the electric resistance of the permanent current switch device in the ordinary conduction state is required to be set to a value equal to or more than a certain value. In consequence, it is impossible to adopt as a stabilizing material any metal having a low electric resistance. The permanent switch is hence fatally attended with an unsatisfactory stability of superconductivity and there occurs troubles such as the quenching in many cases. Such features having a trade-off property inevitably appear so long as the permanent current switch is produced with a superconducting material having a low Tc. To overcome this problem, according to proposals of the JP-A-1-194310, JP-A-1-196685, JP-A-1-194310, and JP-A-4-176174, there is used a permanent current switch fabricated with an oxide superconducting material having a high Tc. However, in any one thereof, considerations have not been given to processing of a large amount of heat generated to keep the OFF state of the permanent current switch, which leads to a problem of quite a great loss of the liquid helium.

SUMMARY OF THE INVENTION

The main object of the present invention is to obtain a superconducting system capable of achieving a stable operation in the permanent current mode with a reduced liquid helium loss.

The further object of the present invention is to obtain such a permanent current switch that can be turned on and off while further minimizing the liquid helium loss.

In this situation, according to the present invention, there is provided a system construction in which heat created to keep the permanent current switch in the off state does not enter the liquid helium side, thereby solving the problem above. There is also presented a technology of producing a permanent current switch suitable to construct the superconducting system above.

According to the present invention, the permanent current switch is arranged over a liquid surface of the liquid helium and a heat reflecting plate is disposed between the switch and the surface so that heat created in the switch flows not in the direction toward the liquid helium but in a direction toward the upper portion of the cryostat, thereby solving the problems.

In addition, according to the present invention, the permanent current switch is arranged over a liquid surface of the liquid helium and the switch is disposed in an upper portion or inside a thermal anchor cooled by a liquid nitrogen or the like so that heat created in the switch flows not in the direction toward the liquid helium but in a direction toward the upper portion of the cryostat, thereby solving the problems.

Moreover, the objects above are more effectively achieved by using for the permanent current switch an oxide superconducting material having an adjusted Tc, forming a construction of an apparatus associated with the Tc, and achieving a switching operation in an appropriate method.

BRIEF DESCRIPTION OF THE DRAWINGS

Preferred embodiments of the present invention will now be described in conjunction with the accompanying drawings, in which;

FIG. 6 is a cross-sectional view of a permanent current switch in an embodiment of the present invention.

FIG. 8 is a cross-sectional view of a permanent current switch in an embodiment of the present invention.

DESCRIPTION OF THE PREFERRED EMBODIMENTS

Figure 1:
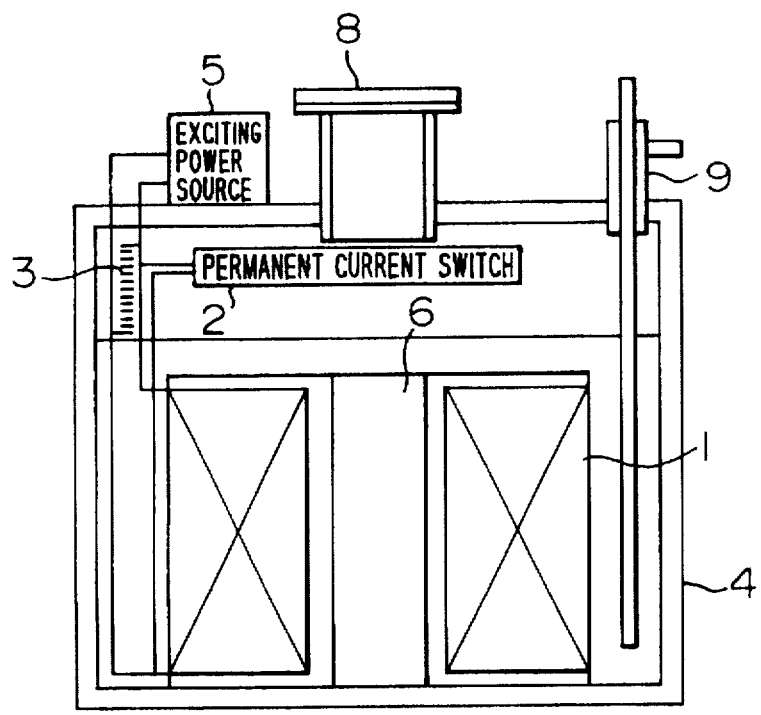
FIG. 1 is a cross-sectional view of a superconducting system in an embodiment of the present invention.

Referring now to FIG. 1, description will be given of a superconducting magnet system according to the present invention.

In FIG. 1a superconducting coil 1 generates a magnetic field. Wiring members created with a superconducting substance including an Nb—Ti alloy are wound together with insulating materials to produce the coil. When the coil is powered, there is created a magnetic field of 3T in the central portion of the coil. A permanent current switch 2 is arranged over the coil 1 and over the liquid surface of a liquid helium. An end portion of the winding of the coil 1 is connected to the permanent current switch 2 via a superconducting connection by the wiring member including the oxide superconducting substance.

A protection resistor 3 is incorporated to absorb, when the superconducting coil achieves transition to an ordinary conduction state, energy accumulated in the superconducting coil so as to prevent burnout of the coil. In this diagram, there is employed a resisting member; however, it is also possible to use a diode. Furthermore, the protection resistor may also be incorporated therein outside a cooling vessel 4.

As the cooling vessel 4, there is adopted a vacuum heat insulating container. The superconducting coil is dipped into the liquid helium to be cooled therein.

An exciting power source 5 excites the coil 1 and is implemented by a direct-current (dc) power source of a constant-current control.

Next, description will be given of an operation method of the superconducting system. The liquid helium is supplied into the cooling vessel 4 to cool the superconducting coil 1. Next, for the permanent current switch 2, a heater is activated; or, a coil attached to the switch 2 is powered to apply a magnetic field to the superconducting wirings formed with the oxide superconducting material in the switch 2. Alternatively, both of the operations above are simultaneously accomplished to set the switch to the off state and then the superconducting coil is excited by the exciting power source 5 to generate a desired magnetic field. Thereafter, the current flowing to the heater or the coil or both of the heater and the coil is interrupted to set the permanent current switch to the on state. Namely, the switch is set to a permanent current mode. The power source 5 is then turned off; moreover, if the power source is unnecessary, it may also be possible to separate the power source.

When the superconducting system has a structure in which the permanent current switch is soaked into the liquid helium, all of heat supplied to set the permanent current switch to the off state contributes to evaporation of the liquid helium. In consequence, it is preferable that the switch is not dipped into the liquid helium but is arranged at a position possibly far away from the liquid surface of the liquid helium.

As shown in FIG. 1, employing a system construction in which the permanent current switch is disposed over the surface of the liquid helium in the cryostat, the quantity of heat which is generated to keep the switch in the off state and which enters the liquid helium side can be minimized.

Figure 2:
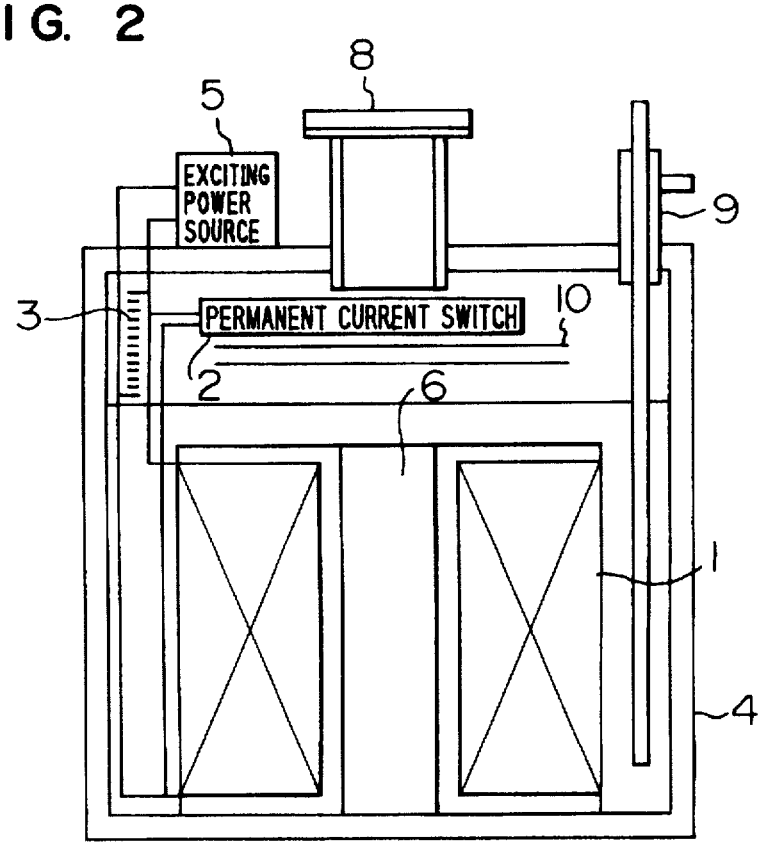
FIG. 2 is a cross-sectional view of a superconducting system in an embodiment of the present invention.

In addition, as shown in the present invention of FIG. 2, disposing a heat reflecting plate 10 between the surface of the liquid helium and the permanent current switch, it is possible to much more decrease the quantity of heat which is generated to keep the switch in the off state and which enters the liquid helium side.

Figure 3:
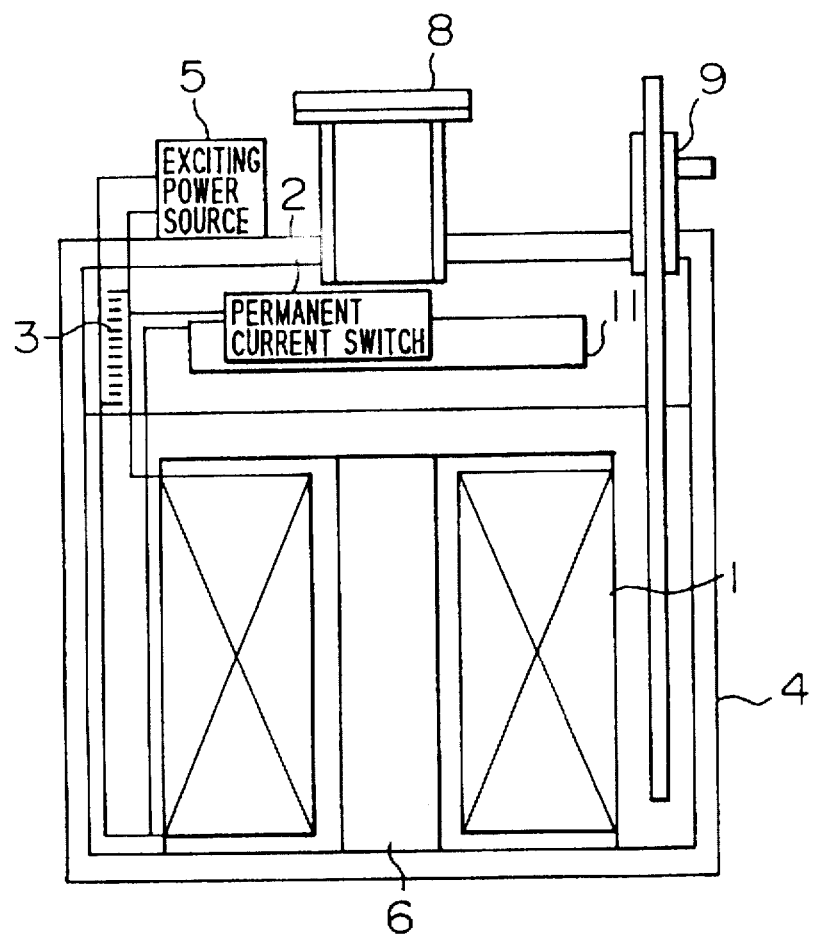
FIG. 3 is a cross-sectional view of a superconducting system in an embodiment of the present invention.

In addition, as shown in the present invention of FIG. 3, arranging the permanent current switch inside or just above a thermal anchor 11 disposed in an upper portion of the cryostat, it is possible to further decrease the quantity of heat which is generated to keep the switch in the off state and which enters the helium liquid side.

Furthermore, the loss of the liquid helium can be remarkably lowered by guiding the helium gas evaporated from the liquid helium to a place where the permanent current switch is installed so as to cool the switch.

In a superconducting system using both of a superconducting material including an alloy or a metal compound and an oxide superconducting material, a superconducting connection therebetween is an important technical issue. Although both superconducting materials can be connected to each other through a superconducting connection, there exist technical difficulties such as a chemical reaction therebetween and a high cost. When an oxide superconducting material having a high Tc is cooled to 10K or less, the order parameter of superconduction is also increased. When the material is brought into contact with such a metal having a lower electric resistance as copper or silver, the penetration distance of superconductivity into the metal is elongated. Accordingly, even without directly connecting the superconducting material including an alloy or a metal compound to the oxide superconducting material through a superconducting connection, it is possible to establish a superconducting connection therebetween in a state where a metal having a lower electric resistance as copper or silver having a thickness equal to or less than 100 nm is disposed therebetween. However, the coupling section is weak against a magnetic field and is consequently arranged in a position to be applied with a weak magnetic field, or the peripheral thereof is covered with a magnetic shield to prevent the magnetic field from being applied thereto, thereby guaranteeing a satisfactory superconducting connectivity.

As for a superconducting magnet system operated according to the liquid helium cooling, it has been known that when an oxide superconducting material is used in the current lead section, the quantity of consumed liquid helium is lowered. In a case of such a system, the overall system can be simplified by establishing a connection through a short circuit between the current leads by use of a permanent current switch including an oxide superconducting material.

In the superconducting system of the present invention, an oxide superconducting material is employed for the permanent current switch. There can be used oxide superconducting materials represented by the following composition fomulae or derivatives thereof:

(where Ln stands for a rare earth element such as Y, Ho, or Er, and 0<d<1.0),

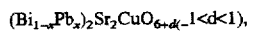

$(Bi_{1-x}Pb_x)_2Sr_2Ca_{1-y}Ln_yCu_2O_{8+d}$ (where Ln stands for a Yttrium or a lanthanoid element or more, and $-1<d<1$).

$(Bi_{1-x}Pb_x)_2Sr_2Ca_2Cu_3O_{10+d}(-1<d<1)$, $Tl_2(Ba_{1-x}Sr_x)_2CuO_{6+d}(-1<d<1, 0\pm x\pm 0.5)$, $Tl_2(Ba_{1-x}Sr_x)_2Ca_{1-y}Ln_yCU_2O_{8+d}$ (where Ln stands for Yttrium or a lanthanoid element or more, and $-1<d<1$, $0\pm x\ \pm 0.5$), $Tl_2Ba_2Ca_2Cu_3O_{10+d}(-1<d<1)$, $(Tl_{1-x-y}Bi_xPb_y)$, $(Sr_{1-z}Ba_z)_2Ca_{1-y}Ln_yLn_yCu_2O_{7+d}$ (where Ln stands for Yttrium or a lanthanoid element or more, and $0\leq x\leq 0.3$, $0\leq y\leq 0.6$, $0\leq x+y\leq 0.6$, $0\leq z\leq 1.0$, $-1<d<1$),$(Tl_{1-x-y}Bi_xPb_y)(Sr_{1-z}Ba_z)_2 Ca_2Cu_3O_{9+d}(0\leq x\leq 0.3$, $0\leq y\leq 0.6$,$0\leq x+y\leq 0.6$, $0\leq z\leq 1.0$,$-1<d<1$).

An oxide superconducting material has in an ordinary conduction state a resistivity which is two orders larger than that of a superconducting material related to an alloy or a metal compound, thereby implementing a permanent current switch having a more compact size. Unlike the case of a permanent current switch using a superconducting material related to an alloy or a metal compound, in a case of a permanent current switch employing an oxide superconducting material, the critical temperature is set to a higher value to increase the margin with respect to the refrigerant, thereby keeping stability of the superconduction.

According to the present invention, to most efficiently operate the superconducting system designed, the composition ratio of the oxide superconducting material used for the permanent current switch is appropriately adjusted so as to fabricate the permanent current switch with a superconducting material having a desired Tc.

For example, when the place where the permanent current switch is disposed cannot be sufficiently apart from the liquid helium surface due to design of the superconducting system, the temperature of the place is considerably lowered (e.g., 20K). In such a case, when Tc of the superconducting material utilized for the switch is set to a high value (e.g., 90K), in order to set the switch to the off state, a heater is required to heat the switch with a comparable power. This is unfavorable because that a large amount of heat is unnecessarily fed into the cryostat and hence the liquid helium is unnecessarily evaporated. In this case, it is only necessary to adjust the composition of the oxide superconducting material to develop a low Tc in a range from about 20K to about 40K so as to fabricate the permanent current switch therewith. In order to set Tc in the range, the composition need only be adjusted to set the formal charge of copper constituting the material to be in a range from 2.02 to 2.05.

Moreover, in a case of design in which the switch is arranged at a position which is over the liquid helium surface and which is apart from the liquid surface to a certain extent, for example, at a position where the temperature is about 40K in the cryostat, the switch need only be manufactured with an oxide superconducting material of which Tc is adjusted to about 40K to about 60K. To set Tc in the range, the composition need only be adjusted to set the formal charge of copper constituting the material to be in a range from 2.05 to 2.09.

Furthermore, in a case of design in which the switch is arranged at a position which is over the liquid helium surface and which is sufficiently apart from the helium surface, for example, at a position where the temperature is about 60K in the cryostat, the switch need only be manufactured with an oxide superconducting material of which Tc is adjusted to about 60K to about 80K. To set Tc in the range, the composition need only be adjusted to set the formal charge of copper constituting the material to be in a range from 2.09 to 2.12.

As above, by devising the location of the permanent current switch and the arrangement of the other constituent elements and by adjusting Tc of the oxide superconducting material applied to the switch to match the design of the system, there can be configured a superconducting system of a reduced loss of liquid helium.

Figure 4:
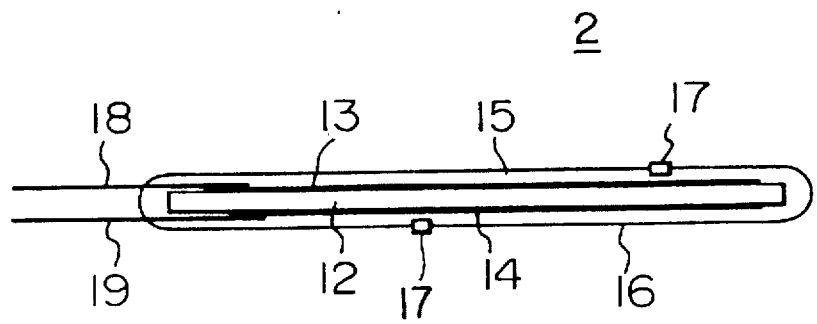
FIG. 4 is a cross-sectional view of a permanent current switch used in the embodiments of the present invention.

FIG. 4 is a cross-sectional view of a permanent current switch to which the present invention is applied.

A permanent switch 2 includes as shown in FIG. 4 a current wire ring 13 formed with an oxide superconducting material on an upper surface of a substrate 12. On a bottom surface of the substrate, there is attached a heater 14. A case 16 is disposed to accommodate the obtained constitution with a space 15 therebetween. The case 16 includes at least one hole 17 therein.

When the heater is powered, the temperature is increased and the superconducting state is disturbed to develop a resistance. With provision of the space case 16, heat cannot be unnecessarily transferred to the liquid helium side. Namely, the permanent current switch can keep the ordinary conduction state with a reduced heater power.

To turn the permanent current switch on and off, it is undesirable to effect the control operation only with heat because a large quantity of heat is delivered into the cryostat. To overcome this difficulty, when it is desired to turn the switch off, a magnetic field is applied to the superconducting element together with heat such that a finite resistance is created in the element with a small amount of heat applied thereto, thereby effectively achieving the switching operation. In this situation, the magnetic field conducts an efficient switching function when the oxide superconducting material used in the system is as follows.

$Tl_2(Ba_{1-x}Sr_x)_2CuO_{6+d}(-1<d<1, 0\leq x\leq 0.5)$, $Tl_2(Ba_{1-x}Sr_x)_2Ca_{1-y}Ln_yCu_2O_{8+d}$ (where Ln stands for a Yttrium or a lanthanoid element or more, and,$-1<d<1$,$0\leq x\ \leq 0.5$), $Tl_2Ba_2Ca_2Cu_3O_{10+d}(-1<d<1)$, $(Tl_{1-x-y}Bi_xPb_y)$ $(Sr_{1-z}Ba_z)_2Ca_{1-y}Ln_yCu_2O_{7+d}$ (where Ln stands for Yttrium or a lanthanoid element or more, and $0\leq x\leq 0.3, 0\leq y\leq 0.6, 0\leq x+y\leq 0.6, 0\leq z\ \leq 1.0, -1<d<1$).

Figure 5:
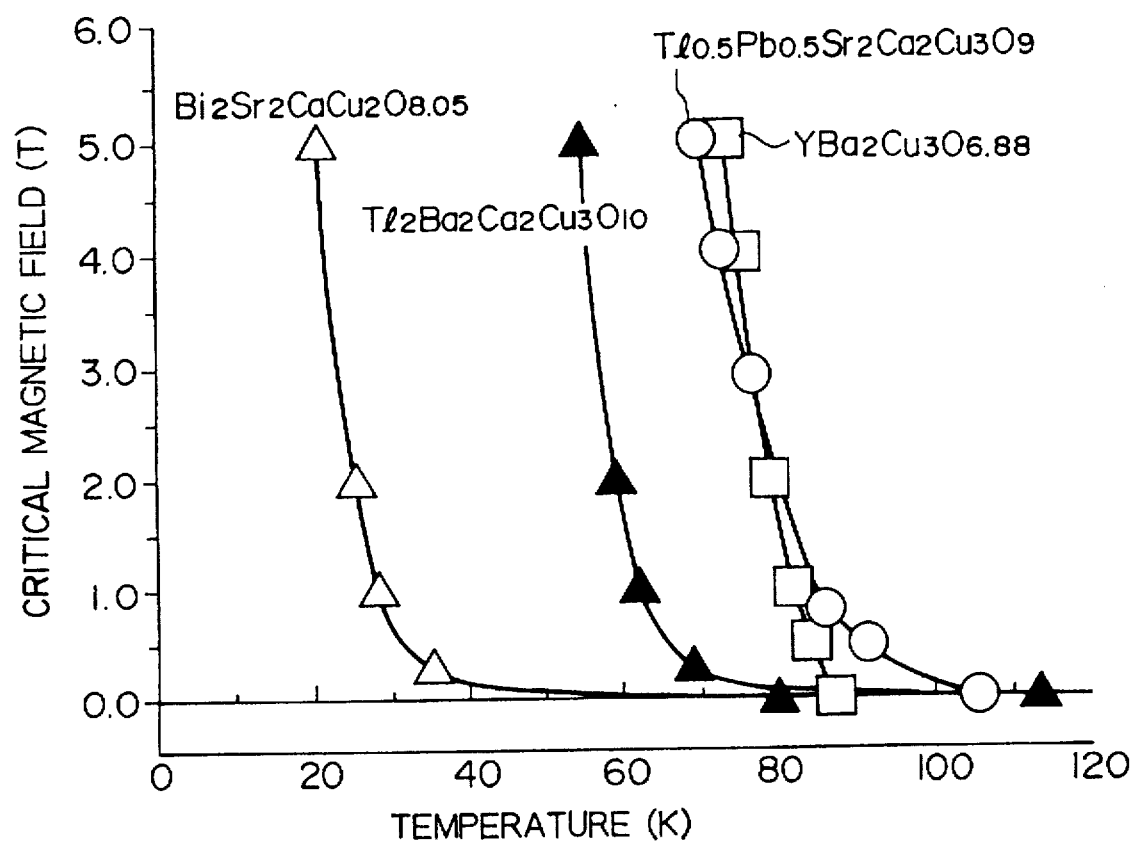
FIG. 5 is a diagram showing temperature dependence of irreversible magnetic fields of respective oxide superconducting materials used to explain in articles of operation for the description of the present invention.

The magnetic field is more effective when the material is as follows:

$(Bi_{1-x}Pb_x)_2Sr_2CuO_{6+d}(-1<d<1)$, $(Bi_{1-x}Pb_x)_2Sr_2Ca_{1-y}Ln_yCu_2O_{8+d}$ (where Ln stands for Yttrium or a lanthanoid element or more, and $-1<d<1$),$(Bi_{1-x}Pb_x)_2Sr_2Ca_2CU_3O_{10+d}(-1<d<1)$. The reason therefor will be easily understood from the irreversible magnetic field (minimum magnetic field; the zero-resistance current is missing when the applied magnetic field becomes higher than the minimum magnetic field) and the temperature dependence of each oxide superconducting material shown in FIG. 5, which is a diagram showing temperature dependence of irreversible magnetic fields of respective oxide superconducting materials used to explain in articles of operation for the description of the present invention.

In the oxide superconducting material, the irreversible field appearing when the magnetic field is applied in parallel with the c axis is lower than that appearing when the magnetic field is applied to be vertical to the c axis. Consequently, for the switching, it is favorable to apply the magnetic field in parallel with the c axis.

(Practical Embodiments 1)

A permanent current switch has been produced in the configuration of FIG. 4 according to the present invention.

In the permanent current switch 2, a current wire ring 13 is fabricated on an upper surface of the substrate 12 in the form of a film of an oxide superconducting material having a composition of $Bi_2Sr_2Ca_{0.9}Ho_{0.1}CU_2O_{8.1}$ according to a laser aberration method. As a heater 14, a thin-film heater of manganese is attached onto a bottom surface of the substrate.

The used substrate is a 0.5 mm thick, 20 mm wide, and 30 mm long monocrystalline MgO; whereas, the current wire ring is 4 mm wide, 2 μm thick, and 80 mm long. A case 16 is formed with a polyimid insulating sheet and epoxi resin. A hole 17 having a diameter of about one millimeter is disposed at two positions.

A test is conducted for the permanent current switch cooled by a helium gas to 60K. With the critical current set to 25 A, the heater is turned on to break the superconducting state. In this state, the resistance value is 60 ohms. When one watt of the heater power is supplied, transition takes place ten seconds thereafter from the superconducting state to the ordinary conduction state. After the point, even when the heater power is lowered to 0.1 watt, the ordinary conduction state is kept remained.

Using the permanent current switch, there is fabricated a superconducting system of the constitution shown in FIG. 1.

A superconducting coil 1 generates a magnetic field. With an Nb—Ti alloy, a 3 mm wide and 0.1 mm thick copper is combined to fabricate a tape-shaped wiring material to be wound together with alumina nonwoven fabric to a pancake coil. The pancake coils are configured in a 12-layer structure to obtain the coil.

The coil 1 has winding dimensions as follows. Namely, the inner winding diameter is 20 mm, the outer winding diameter is 60 mm, and the axial length is 40 mm. In the permanent current switch 2, the above coil is arranged at a position where the ambient temperature is 60K±5K in the constant operation of the system.

In the arrangement, the coil 1 has a winding end portion connected to a superconducting wiring member fabricated with an oxide superconducting material $Bi_2Sr_2CaCu_2O_{8.1}$ such that the connecting section is placed in the liquid helium. In the coupling portion, $Bi_2Sr_2CaCu_2O_{8.1}$ and an Nb—Ti alloy are arranged to enclose silver with a distance of 70 nm therebetween. The obtained item is covered with a magnetic shield formed with $Bi_2Sr_2CaCu_2O_{8.1}$. As a result of various discussions, when the distance is 100 nm or more, the superconductivity of the coupling portion is interrupted five times or more in 100 hours. When the distance is set to be 100 nm or less, the superconductivity of the coupling portion is not interrupted even once in the 100-hour operation. In a case of the configuration where the distance is at most 100 nm and the coupling portion is covered with a magnetic shield formed with $Bi_2Sr_2CaCu_2O_{8.1}$, the superconductivity of the coupling portion is not interrupted even once in the 1000-hour operation. Conducting various discussions of the metal layer enclosed between $Bi_2Sr_2CaCu_2O_{8.1}$ and an Nb—Ti alloy, there have been attained similar results also with pure copper, a copper alloy with the copper content of 90%, and a silver alloy with the silver content of 90%.

Moreover, between the permanent current switch 2 and the superconducting wiring member fabricated with the oxide superconducting material $Bi_2Sr_2CaCu_2O_{8.1}$, there is established a superconducting connection.

As the protective resistance 3, there is employed a one-ohm resistor in this embodiment. For the cooling vessel 4, there is used a vacuum insulation container made of a stainless steel. As the exiting power source 5, there is adopted a dc power source of the constant current control.

Filling the vessel 4 with liquid helium to cool the superconducting coil and then heater of the switch 2 is supplied with one-watt power to heat the switch to the off state so as to thereafter excite the superconducting coil by the exiting power source 5 to generate a magnetic field. When a 20-ampere current is supplied, a 1T magnetic field is created in the central portion of the coil. The heater is then turned off to set the permanent current switch to the on state, i.e., the permanent current mode. Separating the power source, the attenuating state of the magnetic field produced by the coil is checked, which results in an attenuation quantity of 0.01% or less at a point of time 1000 hours thereafter, thereby confirming that there exists no problem for practices. In addition, as compared with a case of the system configuration in which the permanent current switch 2 is dipped in the liquid helium, the quantity of evaporated liquid helium is about 1/50 when the permanent current switch 2 is kept in the off state.

According to the present invention, it can be appreciated that a superconducting system achieving a stable operation in the permanent current mode can be realized with an evaporation loss of liquid helium which is quite smaller than that of the conventional method.

(Practical Embodiment 2)

Fabricating a superconducting system similar to that of the first embodiment, there are additionally installed two heat reflection plates 10 as shown in FIG. 2. With the provision, as compared with a case of the system configuration in which the permanent current switch 2 is dipped in the liquid helium, the quantity of evaporated liquid helium is about 1/100 when the permanent current switch 2 is kept in the off state. Furthermore, even in the 1000-hour operation thereof in the permanent current mode, there does not occur any case of interruption of the superconductivity. As a result, it can be understood that the loss of liquid helium is further suppressed by arranging the heat reflection plates between the permanent current switch and the helium liquid surface.

(Practical Embodiment 3)

For the second embodiment, the configuration is modified such that there is additionally disposed a guide in the cryostat to collect flows of evaporated helium gas into the permanent current switch 2, namely, the evaporated cool helium gas is gathered in the section of the switch 2. With the modification, as compared with a case of the system configuration in which the permanent current switch 2 is dipped in the liquid helium, the quantity of evaporated liquid helium is about 1/120 when the permanent current switch 2 is kept in the off state. Moreover, even in the 1000-hour operation thereof in the permanent current mode, there does not occur any case of interruption of the superconductivity. Resultantly, it can be appreciated that the loss of liquid helium is much more suppressed by introducing the mechanism in which the gas evaporated from the liquid helium cooling the superconducting magnet is used to cool the permanent current switch.

(Practical Embodiment 4)

Manufacturing a superconducting system similar to that of the first embodiment, there is additionally installed a thermal anchor 11 so as to arrange the switch 2 just thereabove as shown in FIG. 3. With the provision, as compared with a case of the system configuration in which the permanent current switch 2 is soaked into the liquid helium, the quantity of evaporated liquid helium is about 1/100 when the permanent current switch 2 is kept in the off state. Furthermore, even in the 1000-hour operation thereof in the permanent current mode, there does not occur any case of interruption of the superconductivity. Even when the switch 2 is buried in the thermal anchor, there is attained a similar result.

According to the result above, it can be appreciated that the loss of liquid helium is further suppressed when the permanent current switch is arranged in or just above the thermal anchor disposed in an upper portion of the cryostat.

(Practical Embodiment 5)

Superconducting wiring members are fabricated with 160 kinds of oxide superconducting materials having the following composition formulae:

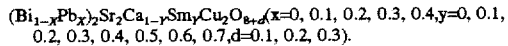

$(Bi_{1-x}Pb_x)_2Sr_2Ca_{1-y}Sm_yCu_2O_{8+d}$ (x=0, 0.1, 0.2, 0.3, 0.4, y=0, 0.1, 0.2, 0.3, 0.4, 0.5, 0.6, 0.7, d=0.1, 0.2, 0.3).

Silver is employed as a stabilizer, and the ratio in terms of weight of the superconducting material in the overall wiring member is set to 90%. Using the wiring member, there is produced a permanent current switch having the structure shown in FIG. 6. The wiring member is wound in the form of a solenoid to prepare a coil 20. In this situation, the c axis of the crystal of the oxide superconducting material is aligned to the longitudinal direction of the coil. In the coil 20, a coil 21 serving functions of an electronic magnet and a heater is formed with a copper wire and is arranged. These elements are accommodated in a case 22. A hole 23 is disposed at two positions of the case 22.

Incorporating 160 types of permanent current switches thus produced into the magnet system shown in FIG. 2, there has been conducted evaluation of performance thereof.

(1) For $0 \leq x-0.5y+d \leq 0.02$

Tc of the oxide superconducting material is less than 20K and is too low such that when the permanent current switch is arranged at any location in the cryostat over the liquid helium surface, the on state of the switch is unstable and the superconducting state is often interrupted.

(2) For $0.02 \leq x-0.5y+d \leq 0.05$

Tc of the oxide superconducting material is 20K to 40K.

Changing the place where the permanent current switch is disposed, the stability has been checked. In a case where the switch is installed in a place at an environmental temperature less than Tc of the used oxide superconducting material by at least 20K (for example, an environmental temperature equal to or less than 15K for Tc=35K), even in the 100-hour operation thereof in the permanent current mode, there does not occur any case of interruption of the superconductivity. However, when the switch is installed in a place having a reduced temperature margin, in the 100-hour operation, there occurs at least once a case of interruption of the superconductivity.

(3) For $0.05 \leq x-0.5y+d \leq 0.09$

Tc of the oxide superconducting material is 40K to 60K.

Changing the place where the permanent current switch is installed, the stability has been examined. In a case where the switch is disposed in a place at an environmental temperature less than Tc of the used oxide superconducting material by at least 20K (for example, an environmental temperature equal to or less than 30K for Tc=50K), even in the 100-hour operation thereof in the permanent current mode, there does not occur any case of interruption of the superconductivity. However, when the switch is installed in a place having a reduced temperature margin, there occurs at least once a case of interruption of the superconductivity in the 100-hour operation.

(4) For $0.09 \leq x-0.5y+d \leq 0.12$

Tc of the oxide superconducting material is 60K to 80K.

Changing the place where the permanent current switch is installed, the stability has been checked. In a case where the switch is installed in a place at an environmental temperature less than Tc of the used oxide superconducting material by at least 20K (for example, an environmental temperature equal to or less than 50K for Tc=70K), even in the 100-hour operation thereof in the permanent current mode, there does not occur any case of interruption of the superconductivity. However, when the switch is installed in a place having a reduced temperature margin, there occurs at least once a case of interruption of the superconductivity in the 100-hour operation.

(5) For $0.12 \leq x-0.5y+d \leq 0.2$

Tc of the oxide superconducting material is 80K to 90K.

Changing the place where the permanent current switch is arranged, the stability has been checked. In a case where the switch is installed in a place at an environmental temperature less than Tc of the used oxide superconducting material by at least 20K (for example, an environmental temperature equal to or less than 70K for Tc=90K), even in the 100-hour operation thereof in the permanent current mode, there does not occur any case of interruption of the superconductivity. However, when the switch is installed in a place having a reduced temperature margin, there occurs at least once a case of interruption of the superconductivity in the 100-hour operation.

It can be recognized that the superconducting system is lead to a stable operation in the permanent current mode by using for the switch an oxide superconducting material having a composition adjusted to have a superconducting critical temperature higher by 20K than that of the portion where the switch is arranged.

In addition, as a switching mechanism to produce the off state of the permanent current switch, there is fabricated a permanent current switch for which only heat is used (the member 21 is not wound like in a solenoid shape of FIG. 6, namely, a high-resistive heating wire is used for the member 21). As a result of comparisons therebetween, according to any one of the cases (1) to (5) of the embodiments, in the switch of the type using both of heat and the magnetic field, the liquid helium loss is from 1/2 to 1/5 of that of the switch of the other type.

Moreover, permanent current switches are produced such that the c axis of the oxide superconducting materials used therefor is within 90±10° with respect to the longitudinal direction of the coil 20 fabricated with the superconducting wiring of FIG. 6. In any case of the oxide superconducting materials of the compositions, when compared with a case where the c axis of the crystal is aligned to be parallel to the longitudinal direction of the coil, in order to turn the permanent current switch off, evaporation of liquid helium is increased to twice or more. This indicates effectiveness of alignment of the c axis of the oxide superconducting material to be parallel to the magnetic field to achieve the switching operation.

(Practical Embodiment 6)

Using many kinds of oxide superconducting materials having the following composition formulae:

$Tl_2(Ba_{1-x}Sr_x)_2Ca_{1-y}Eu_yCU_2O_{8+d}$(x=0, 0.1, 0.2, 0.3, 0.4, 0.5, 0.6, 0.7, 0.8, 0.9, 1.0,y=0, 0.1, 0.2, 0.3, 0.4, 0.5, 0.6, 0.7,d=0, 0.1, 0.2); $(Bi_{1-x}Pb_x)_2Sr_2CuO_{6+d}$(x=0, 0.1, 0.2, 0.3, 0.4,d=0, 0.1, 0.2, 0.3); or $Tl_2(Ba_{1-x}Sr_x)_2CuO_{6+d}$ (x=0, 0.1, 0.2, 0.3, 0.4, 0.5, 0.6, 0.7,d=0, 0.1, 0.2, 0.3), there are produced superconducting wiring members so as to test performance of permanent current switches in the same manner as for the fifth embodiment.

Also in any case using the oxide superconducting materials of the compositions, there are attained a result similar to that of the second embodiment only when Tc is identical.

(Practical Embodiment 7)

Figure 7:
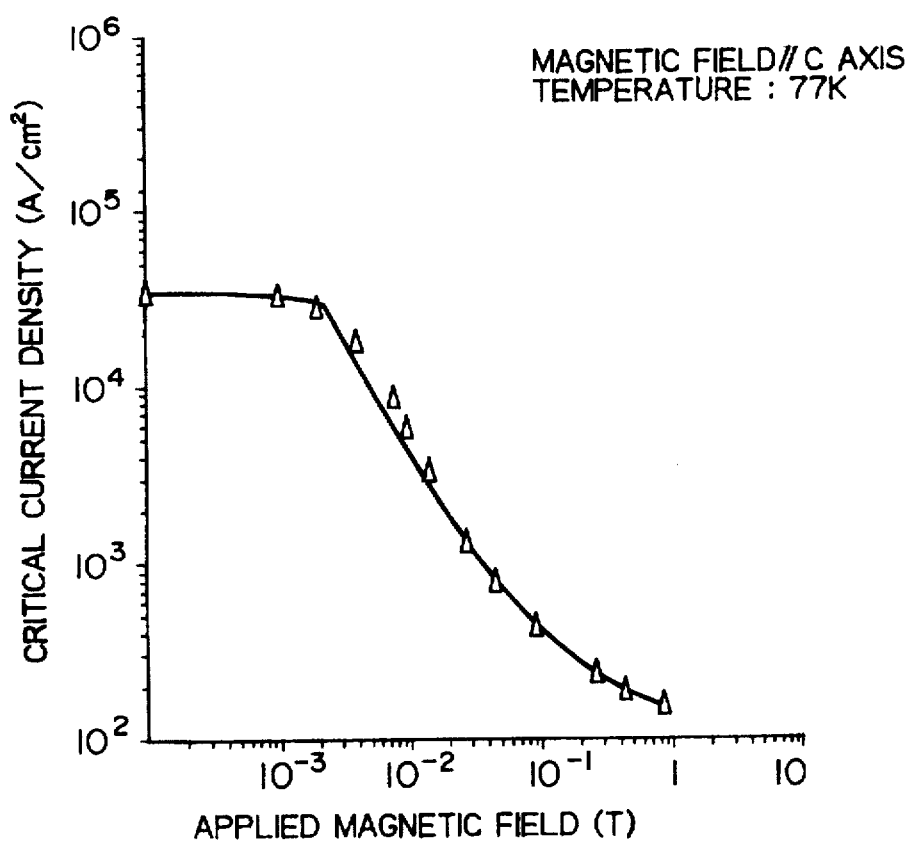
FIG. 7 is a diagram showing magnetic field dependence of critical current densities of superconducting wiring members used in the embodiments of the present invention.

Using an oxide superconducting material $YBa_2Cu_3O_{6.85}$, there is produced a superconducting wring member. In a particle boundary portion, a thin layer of $BaCO_3$ is deposited to establish a weak superconduction coupling in crystal particle boundary between the superconducting materials. FIG. 7 shows the magnetic field dependence of the critical current density of the wiring member at 77K.

FIG. 8 is a cross-sectional view of a permanent current switch in an embodiment of the present invention.

Using the superconducting wiring material of this kind, there is fabricated a permanent current switch having a configuration shown in FIG. 8 to be incorporated into the superconducting system shown in FIG. 1, thereby conducting tests thereof. In FIG. 8, on the outer side of a coil 20 created by winding the superconducting wiring member in a solenoid shape, there is incorporated a coil serving functions of an electromagnet and a heater. Moreover, the permanent current switch is disposed in a place where the temperature is 77K±5K in the cryostat. Applying a magnetic field of 100 G or more, the switch can be turned off. After excitation, the magnetic field is removed to turn the switch on and then the power source is separated so as to examine the attenuating state of the magnetic field generated by the coil. The attenuation quantity is 0.01% or less at a point of time 100 hours thereafter, thereby confirming that there does not exist any problem for practices.

(Practical Embodiment 8)

Using an oxide superconducting material $Tl_2Ba_2Ca_2Cu_3O_{10.05}$(Tc=120K), there is produced a permanent current switch to be incorporated into the superconducting system shown in FIG. 3, thereby conducting tests thereof. In FIG. 3, a superconducting coil 1 generates a magnetic field. A wiring member is manufactured with a superconducting material of an Nb—Ti alloy to be wound with an insulator so as to produce a coil. When powered, the coil generates a 3T magnetic field in the central portion thereof. The switch 2 is arranged over the coil 1 and the surface of the liquid helium, specifically, at a place where the temperature is 77K±5K when the system is operated with a permanent current. A superconducting connection is established between a winding end portion of the coil 1 and the switch 2 by a wiring member formed with an oxide superconducting material. In a connecting section between the coil 1 and the superconducting wiring member, the oxide superconducting material is connected to an Nb—Ti alloy via a 70 nm thick silver layer. In this section, the thickness of silver is favorably 100 nm or less. It has been confirmed that when the thickness exceeds 100 nm, the critical current density is remarkably lowered in the coupling section. Moreover, the similar results are attained also when copper is used in place of silver.

There is incorporated a protective resistor 3 such that when the superconducting coil effects transition to a normal conduction state, the resistor 3 absorbs energy accumulated in the coil, thereby preventing burnout of the coil. Although a resisting item is used in this diagram, there may be employed a diode. In addition, the protective resistor may also be arranged outside the cooling vessel 4. As the vessel 4, there is employed a vacuum insulating container. An exiting power source 5 excites the coil and is implemented by use of a dc power source of the constant current control.

Liquid helium is supplied to the vessel 4 to cool the coil 1 and then the heater is activated for the switch 2 to set the switch to the off state so as to excite the superconducting coil by the exciting power source 5, thereby generating a 3T magnetic field. In this situation, the heater produces heat of 5 W. However, since the permanent current switch is outside the liquid helium and is located in an upper portion of the cryostat and over the thermal anchor, even when the thermal margin of the switch is increased to 40K or more, namely, even when much heat is produced in the switch section to turn the switch off, the quantity of evaporated liquid helium is small. The quantity can be set to a value which is larger by about 5% than that of evaporated liquid helium of the first embodiment. Thereafter, the current being supplied to the heater is turned off to set the switch to the on state, i.e., the permanent mode and then the power source 5 is separated. Examining the attenuation state of the magnetic field generated by the coil, the attenuation quantity is 0.001% or less at a point 1000 hours thereafter. It can be appreciated that with a large temperature margin for the permanent current switch, there is achieved a stable operation in the permanent current mode.

(Practical Embodiment 9)

Utilizing 20 kinds of oxide superconducting materials having Tc not less than 60K, there are fabricated permanent current switches in the structure shown in FIG. 8 to be incorporated in a superconducting magnet system similar to that of the eighth embodiment. Setting the switch to positions of various temperatures equal to or more than 60K, there are checked differences between Tc of used the oxide superconducting material and the temperature of the installation positions and the stability of the switch. In a case where the difference therebetween is 20K or less, the quenching has sometimes appeared. Setting the temperature difference to at least 20K, there has not occurred the quenching in the 100-hour operation test in the permanent current mode. This indicates that Tc of the oxide superconducting material of the switch is required to be at least 20K higher than the temperature of a position where the switch is disposed.

Moreover, it has been found that in the situation above when the switch is disposed in a place to which the gas produced through evaporation of the liquid helium is delivered, the loss of liquid helium can be lowered by about 10%. (Practical Embodiment 10)

Manufacturing a superconducting magnetic system analogous to that of the eighth embodiment, only the superconducting coil 1 is replaced with a comparable coil capable of generating a magnetic field of up to 8T. There have been conducted tests in the permanent current mode according to the same procedure as for the case the eighth embodiment.

Checking the attenuation state of the magnetic field generated by the coil, the attenuation quantity is 0.001% or less at a point of time 1000 hours thereafter. It can be appreciated that also in a system using an 8T coil, there is achieved quite a stable operation in the permanent current mode.

(Practical Embodiment 11)

Figure 9:
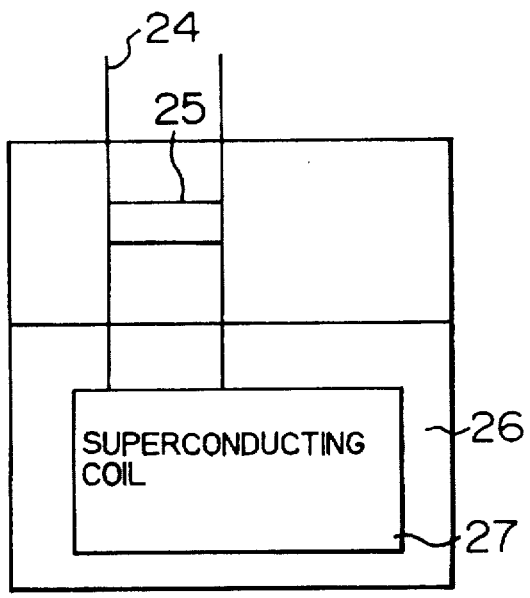
FIG. 9 is a cross-sectional view of a superconducting system in an embodiment of the present invention.

Utilizing a superconducting magnet system in which, as shown in FIG. 9, a permanent current switch produced with an oxide superconducting material is disposed to establish a short circuit between intermediate points of current lead wires fabricated with an oxide superconducting material. A reference numeral 24 indicates current lead wires manufactured with an oxide superconducting material, a numeral 25 stands for a permanent current switch fabricated with an oxide superconducting material, a numeral 26 denotes liquid helium, and a numeral 27 designates a superconducting coil. With the configuration above, unnecessary wirings can be dispensed with and the overall system can be simplified.

According to the present invention, there can be attained a superconducting system capable of achieving a stable operation in the permanent current mode with a reduced liquid helium loss. In addition, according to the present invention, the permanent current switch can be turned on and off while further minimizing the liquid helium loss.

What is claimed is:

1. A superconducting magnet system comprising:
   a superconducting magnet immersed in liquid helium;
   a permanent current switch for selectively enabling a current to flow in the superconducting magnet and interrupting a current flowing in the superconducting magnet; and
   a cryostat for accommodating the superconducting magnet, the liquid helium, and the permanent current switch;
   wherein the permanent current switch is disposed over a liquid surface of the liquid helium.

2. A superconducting magnet system according to claim 1, wherein the permanent current switch is cooled by a gas resulting from evaporation of the liquid helium in which the superconducting magnet is immersed.

3. A superconducting magnet system according to claim 1, further comprising at least one heat reflecting plate disposed between the permanent current switch and the liquid surface of the liquid helium.

4. A superconducting magnet system according to claim 1, wherein the permanent current switch is disposed in or just over a thermal sink disposed in an upper portion of the cryostat.

5. A superconducting magnet system according to claim 1, wherein the superconducting magnet and the permanent current switch are manufactured with a superconducting wiring material including an oxide superconducting material.

6. A superconducting magnet system comprising:
   a superconducting magnet operated in a state cooled by liquid helium; and
   a permanent current switch including an oxide superconducting material;
   wherein the oxide superconducting material has a composition adjusted to have a superconducting critical temperature 20K higher than a temperature of a portion of the superconducting magnet system where the permanent current switch is disposed.

7. A superconducting magnet system according to claim 6, wherein the composition is represented by a composition formula $(Bi_{1-x}Pb_x)_2Sr_2Ca_{1-y}Ln_yCu_2O_{8+\delta}$

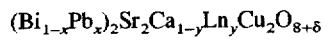

wherein Ln stands for yttrium or a lanthanoid element or more, $-1<\delta<1$, and $0.02 \leq x - 0.5y\delta \leq 0.12$.

8. A superconducting magnet system according to claim 6, wherein the composition is represented by a composition formula $Tl_2(Ba_{1-x})_2Ca_{1-y}Ln_yCu_2O_{8-\delta}$

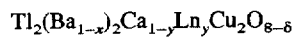

wherein Ln stands for yttrium or a lanthanoid element or more, $-1<\delta<1.0 \leq x \leq 0.5$, and $0.02 \leq x-0.5y+\delta \leq 0.12$.

9. A superconducting magnet system according to claim 6, wherein the composition is represented by a composition formula $(Bi_{1-x}Pb_x)_2Sr_2CuO_{6-\delta}$

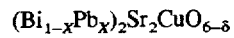

wherein $-1<\delta<1$ and $0.02 \leq 2x+2\delta \leq 0.12$.

10. A superconducting magnet system according to claim 6, wherein the composition is represented by a composition formula $Tl_2(Ba_{1-x}Sr_x)_2CuO_{6+\delta}$

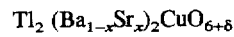

wherein $0 \leq x \leq 0.5$ and $0.02 \leq 2\delta \leq 0.12$.

11. A superconducting magnet system comprising:
    a superconducting magnet operated in a state cooled by liquid helium; and
    a permanent current switch including an oxide superconducting material;
    wherein the superconducting magnet and the permanent current switch are electrically connected to each other at a connecting portion by both of (1) a superconducting material of an alloy or a metal compound and (2) an oxide superconducting material.

12. A superconducting magnet system according to claim 11, wherein the connecting portion is cooled by the liquid helium or is cooled to a temperature equal to or less than 10K.

13. A superconducting magnet system according to claim 11, further comprising a magnetic shielding material for magnetically shielding the connecting portion;
    wherein the connecting portion is cooled by the liquid helium or is cooled to a temperature equal to or less than 10K.

14. A superconducting magnet system according to claim 11, wherein (1) the superconducting material of an alloy or a metal compound and (2) the oxide superconducting material are connected to each other in the connecting portion via a metallic layer having a thickness of at most 100 nm and including copper, silver, a copper alloy, a silver alloy, or a combination thereof; and
    wherein the connecting portion is cooled by the liquid helium or is cooled to a temperature equal to or less than 10K.

15. A superconducting magnet system comprising:
    a superconducting magnet operated in a state cooled by liquid helium; and
    a permanent current switch including an oxide superconducting material;

wherein the superconducting magnet and the permanent current switch are connected to each other by a superconducting wiring material including an oxide superconducting material.

16. A superconducting magnet system according to claim 15, wherein a portion of the superconducting wiring material connecting the superconducting magnet and the permanent current switch to each other is cooled to a temperature equal to or less than 10K; and wherein the permanent current switch is disposed over a liquid surface of the liquid helium.

17. A superconducting magnet system according to claim 15, further comprising a current lead manufactured with an oxide superconducting material for supplying current to the superconducting magnet;

wherein a portion of the current lead constitutes the superconducting wiring material connecting the superconducting magnet and the permanent current switch to each other.

18. A superconducting magnet system comprising:

a superconducting magnet operated in a state cooled by liquid helium;

a permanent current switch including an oxide superconducting material; and current leads including an oxide superconducting material for supplying current to the superconducting magnet;

wherein the current leads are connected to each other via the permanent current switch, thereby enabling the permanent current switch to establish a short circuit between the current leads.

19. A superconducting magnet system according to claim 1, wherein the permanent current switch is set in an OFF state by simultaneously applying heat and a magnetic field to the permanent current switch, and is set in an ON state by stopping applying the heat and the magnetic field to the permanent current switch or by reducing at least one of the heat and the magnetic field.

20. A superconducting magnet system according to claim 6, wherein the permanent current switch is set in an OFF state by simultaneously applying heat and a magnetic field to the permanent current switch, and is set in an ON state by stopping applying the heat and the magnetic field to the permanent current switch or by reducing at least one of the heat and the magnetic field.

21. A superconducting magnet system according to claim 11, wherein the permanent current switch is set in an OFF state by simultaneously applying heat and a magnetic field to the permanent current switch, and is set in an ON state by stopping applying the heat and the magnetic field to the permanent current switch or by reducing at least one of the heat and the magnetic field.

22. A superconducting magnet system according to claim 15, wherein the permanent current switch is set in an OFF state by simultaneously applying heat and a magnetic field to the permanent current switch, and is set in an ON state by stopping applying the heat and the magnetic field to the permanent current switch or by reducing at least one of the heat and the magnetic field.

23. A superconducting magnet system according to claim 18, wherein the permanent current switch is set in an OFF state by simultaneously applying heat and a magnetic field to the permanent current switch, and is set in an ON state by stopping applying the heat and the magnetic field to the permanent current switch or by reducing at least one of the heat and the magnetic field.

24. A permanent current switch comprising:

a conductor or a coil fabricated with an oxide superconducting material including a copper crystal material having a formal charge set to at least 2.02 and to at most 2.12; and a normal conduction coil disposed in parallel with a longitudinal direction of the conductor or the coil fabricated with the oxide superconducting material.

25. A permanent current switch comprising:

an oxide superconducting material including a copper crystal having a formal charge set to at least 2.02 and to at most 2.12;

wherein the permanent current switch is set in an OFF state by simultaneously applying heat and a magnetic field to the permanent current switch, and is set in an ON state by stopping applying the heat and the magnetic field to the permanent current switch or by reducing at least one of the heat and the magnetic field.

26. A permanent current switch according to claim 24, wherein the oxide superconducting material has a composition formula represented by $(Bi_{1-x}Pb_x)_2Sr_2Ca_{1-y}Ln_yCu_2O_{8+\delta}$ wherein Ln stands for yttrium or a lanthanoid element or more and $-1<\delta<1$, and the composition is adjusted such that x, y, and $\delta$ satisfy an expression $0.02 \leq x-0.5y+\delta \leq 0.12$, thereby adjusting the formal charge of copper.

27. A permanent current switch according to claim 26, wherein the oxide superconducting material has a composition formula represented by $(Bi_{1-x}Pb_x)_2Sr_2Ca_{1-y}Ln_yCu_2O_{8+\delta}$ wherein Ln stands for yttrium or a lanthanoid element or more and $-1<\delta<1$, and the composition is adjusted such that x, y, and $\delta$ satisfy an expression $0.02 \leq x-0.5y+\delta \leq 0.12$, thereby adjusting the formal charge of copper.

28. A permanent current switch according to claim 24, wherein the oxide superconducting material has a composition formula represented by $Tl_2(Ba_{1-x}Sr_x)_2Ca_{1-y}Ln_yCu_2O_{8+\delta}$ wherein Ln stands for yttrium or a lanthanoid element or more, $-1<\delta<1$, $0 \leq x \leq 0.5$), and the composition is adjusted such that x, y, and $\delta$ satisfy an expression $0.02 \leq x-0.5y+\delta \leq 0.12$, thereby adjusting the formal charge of copper.

29. A permanent current switch according to claim 25, wherein the oxide superconducting material has a composition formula represented by $Tl_2(Ba_{1-x}Sr_x)_2Ca_{1-y}Ln_yCu_2O_{8+\delta}$ wherein Ln stands for yttrium or a lanthanoid element or more, $-1<\delta<1, 0 \leq x \leq 0.5$, and the composition is adjusted such that x, y, and $\delta$ satisfy an expression $0.02 \leq x-0.5y+\delta \leq 0.12$, thereby adjusting the formal charge of copper.

30. A permanent current switch according to claim 24, wherein the oxide superconducting material has a composition formula represented by $(Bi_{1-x}Pb_x)_2Sr_2CuO_{6+\delta}$ wherein $-1<\delta<1$ and the composition is adjusted such that x and $\delta$ satisfy an expression $0.02 \leq 2x+2\delta \leq 0.12$, thereby adjusting the formal charge of copper.

31. A permanent current switch according to claim 25, wherein the oxide superconducting material has a composition formula represented by $(Bi_{1-x}Pb_x)_2Sr_2CuO_{6+\delta}$ wherein $-1<\delta<1$ and the composition is adjusted such that x and $\delta$ satisfy an expression $0.02 \leq 2x+2\delta \leq 0.12$, thereby adjusting the formal charge of copper.

32. A permanent current switch according to claim 24, wherein the oxide superconducting material has a composition formula represented by $Tl_2(Ba_{1-x}Sr_x)_2CuO_{6+\delta}$ wherein $-1<\delta<1.0\leq x\leq 0.5$, and the composition is adjusted such that $\delta$ satisfies an expression $0.02\leq 2\delta\leq 0.12$, thereby adjusting the formal charge of copper.

33. A permanent current switch according to claim 25, wherein the oxide superconducting material has a composition formula represented by $Tl_2(Ba_{1-x}Sr_x)_2CuO_{6+\delta}$ wherein $-1<\delta<1.0\leq x\leq 0.5$, and the composition is adjusted such that $\delta$ satisfies an expression $0.02\leq 2\delta\leq 0.12$, thereby adjusting the formal charge of copper.

34. A permanent current switch comprising:

quite a small amount of a non-superconducting material deposited in a boundary between crystal particles of superconducting materials to form a weak superconducting connection in the boundary between the crystal particles of the superconducting materials;

wherein there is employed a superconducting complex adjusted such that a value of a superconducting critical current density is, when applied with a magnetic field of 50 to 300 gauss, at most one-tenth of the superconducting critical current density in the absence of the magnetic field.

35. A permanent current switch according to claim 34, wherein the permanent current switch is set in an OFF state by applying the magnetic field to the superconducting complex, and is set in an ON state by stopping applying the magnetic field from the superconducting complex.

36. A permanent current switch comprising:

a coil manufactured with an oxide superconducting material having a c axis of a crystal of the oxide superconducting material aligned to be parallel to a direction of a magnetic field appearing when a current flows through the coil.

37. A permanent current switch comprising:

a superconducting coil manufactured with an oxide superconducting material having a composition formula represented by $(Bi_{1-x}Pb_x)_2Sr_2Ca_{1-y}Ln_yCu_2O_{8+\delta}$ wherein Ln stands for yttrium or a lanthanoid element or mores $-1<\delta<1$, and the composition is adjusted such that x, y, and $\delta$ satisfy an expression $0.02\leq x-0.5y+\delta\leq 0.12$, thereby adjusting the formal charge of copper;

wherein the oxide superconducting material has a c axis of a crystal of the oxide superconducting material aligned to be parallel to a direction of a magnetic field appearing when a current flows through the coil.

38. A permanent current switch comprising:

a superconducting coil manufactured with an oxide superconducting material having a composition formula represented by $(Bi_{1-x}Pb_x)_2Sr_2CuO_{6+\delta}$ wherein $-1<\delta<1$ and the composition is adjusted such that x and $\delta$ satisfy an expression $0.02\leq 2x+2\delta\leq 0.12$, thereby adjusting the formal charge of copper;

wherein the oxide superconducting material has a c axis of a crystal of the oxide superconducting material aligned to be parallel to a direction of a magnetic field appearing when a current flows through the coil.

39. A permanent current switch comprising:

a superconducting coil manufactured with an oxide superconducting material having a composition formula represented by $Tl_2(Ba_{1-x}Sr_x)_2Ca_{1-y}Ln_yCu_2O_{8+\delta}$ wherein Ln stands for yttrium or a lanthanoid element or more, $-1<\delta<1$, $0\leq x\leq 0.5$, and the composition is adjusted such that y and $\delta$ satisfy an expression $0.002\leq -0.5y+\delta\leq 0.12$, thereby adjusting the formal charge of copper;

wherein the oxide superconducting material has a c axis of a crystal of the oxide superconducting material aligned to be parallel to a direction of a magnetic field appearing when a current flows through the coil.

40. A permanent current switch comprising:

a superconducting coil manufactured with an oxide superconducting material having a composition formula represented by $Tl_2(Ba_{1-x}Sr_x)_2CuO_{6+\delta}$ wherein $-1<\delta<1.0\leq x\leq 0.5$, and the composition is adjusted such that $\delta$ satisfies an expression $0.02\leq 2\delta\leq 0.12$, thereby adjusting the formal charge of copper;

wherein the oxide superconducting material has a c axis of a crystal of the oxide superconducting material aligned to be parallel to a direction of a magnetic field appearing when a current flows through the coil.

* * * * *